United States Patent
Shigemori et al.

[11] Patent Number: 6,154,095
[45] Date of Patent: Nov. 28, 2000

[54] PHASE LOCKED LOOP CLOCK SOURCE PROVIDED WITH A PLURALITY OF FREQUENCY ADJUSTMENTS

[75] Inventors: Mikio Shigemori, Rancho Palos Verdes, Calif.; Hideo Karasawa; Toshihiko Kano, both of Minowa-machi, Japan; Kazushige Ichinose, Nagano-ken, Japan

[73] Assignee: Seiko Epson Corporation, Tokyo, Japan

[21] Appl. No.: 09/171,812

[22] PCT Filed: Feb. 18, 1998

[86] PCT No.: PCT/JP98/00700

§ 371 Date: Jan. 21, 1999

§ 102(e) Date: Jan. 21, 1999

[87] PCT Pub. No.: WO98/38744

PCT Pub. Date: Sep. 3, 1998

[30] Foreign Application Priority Data

Feb. 27, 1997 [JP] Japan .................................. 9-044383

[51] Int. Cl.[7] .................................. H03B 5/32; H03L 7/18
[52] U.S. Cl. .................. 331/16; 331/25; 331/36 C; 331/44; 331/74; 331/158; 331/177 R; 331/177 V; 331/179
[58] Field of Search .................. 331/16, 25, 36 C, 331/68, 74, 158, 177 R, 179, 177 V, 44

[56] References Cited

U.S. PATENT DOCUMENTS

| | | | |
|---|---|---|---|
| 5,451,912 | 9/1995 | Torode | 331/108 C |
| 5,608,770 | 3/1997 | Noguchi et al. | 377/47 |
| 5,877,657 | 3/1999 | Yoshinaka | 331/16 |

FOREIGN PATENT DOCUMENTS

| | | |
|---|---|---|
| 54-51715 | 4/1979 | Japan . |
| 54-152450 | 11/1979 | Japan . |
| 55-16204 | 2/1980 | Japan . |
| 60-191521 | 9/1985 | Japan . |
| 62-293805 | 12/1987 | Japan . |
| 2-207601 | 8/1990 | Japan . |
| 3-214631 | 9/1991 | Japan . |
| 4-335704 | 11/1992 | Japan . |
| 4-351107 | 12/1992 | Japan . |
| 6-77732 | 3/1994 | Japan . |
| 6-152245 | 5/1994 | Japan . |
| 7-263961 | 10/1995 | Japan . |
| 8-8740 | 1/1996 | Japan . |
| 9-116432 | 5/1997 | Japan . |
| 9-289448 | 11/1997 | Japan . |

*Primary Examiner*—Siegfried H. Grimm
*Attorney, Agent, or Firm*—Oliff & Berridge, PLC

[57] ABSTRACT

An oscillator circuit having a first programmable divider for obtaining a reference signal by dividing the frequency of an oscillation signal of a piezoelectric resonator by a frequency dividing number M. A PLL circuit using the reference signal as input thereto to obtain a multiplied signal, the multiplied signal being formed by multiplying the input signal by a second frequency dividing number N for a second programmable divider provided in a feedback circuit. A third programmable divider capable of dividing the frequency of the multiplied signal by a third frequency dividing number X and outputting the frequency-divided signal. The frequency dividing numbers M, N, and X can be set to values independent of each other. Therefore, innumerable combinations of the frequency dividing numbers M, N, and X can be used and the number of frequencies producible by one oscillator can be largely increased by enabling selection of any suitable one of such combinations.

17 Claims, 16 Drawing Sheets

| CASE | M | N | X | fo (KHz) |
|---|---|---|---|---|
| 1 | 765 | 488 | 1 | 16011.5 |
| 2 | 538 | 343 | 1 | 16002.4 |
| 3 | 767 | 489 | 1 | 16002.5 |
| 4 | 651 | 415 | 1 | 16000.8 |
| 5 | 593 | 378 | 1 | 15999.7 |
| 6 | 764 | 487 | 1 | 15999.6 |
| 7 | 513 | 327 | 1 | 15999.4 |
| 8 | 766 | 488 | 1 | 15990.6 | fo = 25,100 KHz

FIG. 5

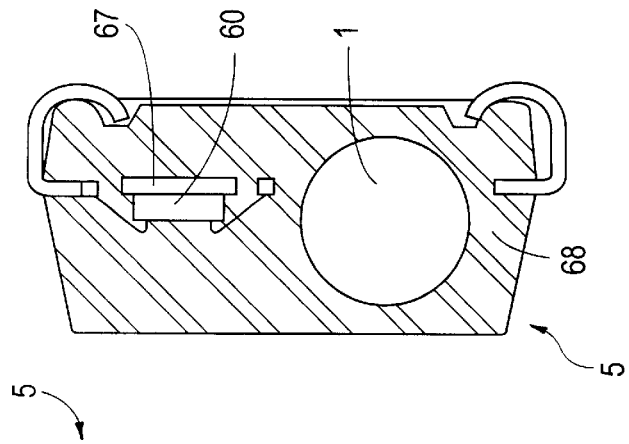
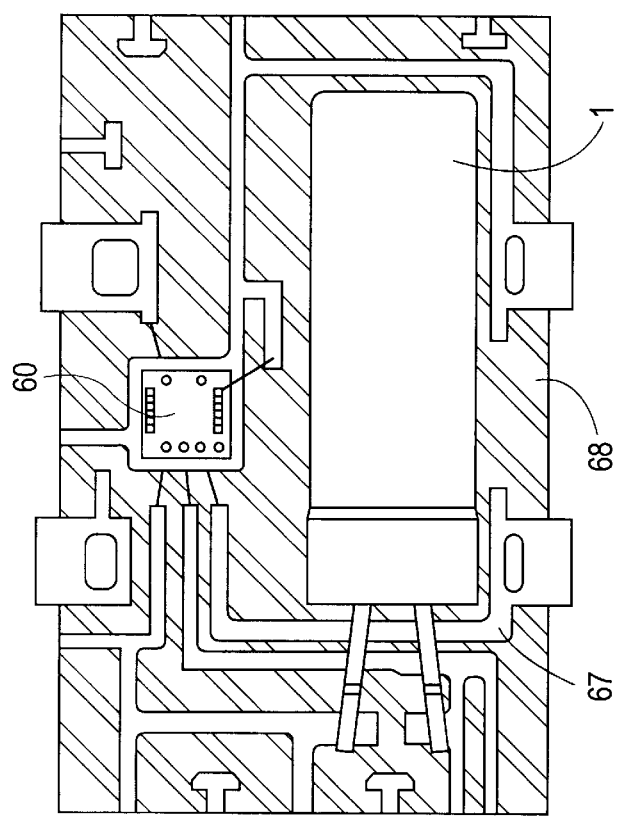
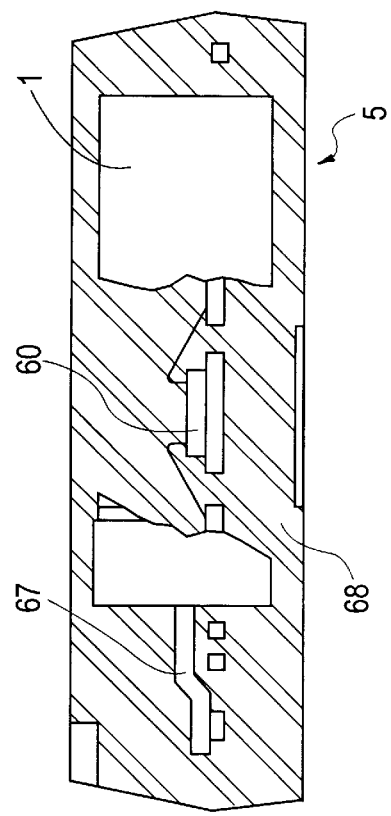
FIG. 11C
FIG. 11A
FIG. 11B

| FREQUENCY SELECTING TERMINAL | | | | FREQUENCY DIVIDING NUMBER SETTING | | | OUTPUT FREQUENCY |
|---|---|---|---|---|---|---|---|
| S3 | S2 | S1 | S0 | M | N | X | (MHZ) |
| H | H | H | H | 2 | 10 | 2 | 50.000 |
| H | H | H | L | 10 | 55 | 2 | 55.000 |
| H | H | L | H | 2 | 12 | 2 | 60.000 |
| H | H | L | L | 10 | 66 | 2 | 66.000 |
| H | L | H | H | 3 | 20 | 2 | 66.667 |
| H | L | H | L | 10 | 73 | 2 | 73.000 |
| H | L | L | H | 2 | 15 | 2 | 75.000 |
| H | L | L | L | 10 | 83 | 2 | 83.000 |
| L | H | H | H | 2 | 16 | 2 | 80.000 |
| L | H | H | L | 10 | 88 | 2 | 88.000 |
| L | H | L | H | 1 | 9 | 2 | 90.000 |
| L | H | L | L | 10 | 99 | 2 | 99.000 |
| L | L | H | H | 1 | 10 | 2 | 100.00 |
| L | L | H | L | 10 | 110 | 2 | 110.00 |
| L | L | L | H | 1 | 25 | 2 | 125.00 |
| L | L | L | L | 10 | 138 | 2 | 138.00 |

QUARTZ OSCILLATION FREQUENCY : fc = 20MHZ

FIG. 19

PHASE LOCKED LOOP CLOCK SOURCE PROVIDED WITH A PLURALITY OF FREQUENCY ADJUSTMENTS

BACKGROUND OF THE INVENTION

1. Field of the Invention

The present invention relates to an oscillator used as a clock source oscillation circuit for an information processor or a communication processor and capable of supplying a signal used as a reference for desired frequencies.

2. Description of Related Art

For use in information processors such as computers or in communication apparatuses, an oscillator in which a piezoelectric resonator such as a quartz resonator is used as an oscillation source has been used as a clock source or the like. Each of processing sections forming an information processor is supplied with a clock signal or the like having a suitable frequency on the basis of a signal supplied from such an oscillator. FIG. 18 shows an example of a conventional oscillator using a PLL circuit. This oscillator 90 is arranged so as to be able to select one of a plurality of frequencies predetermined to be output, and to output a signal having the selected frequency. The oscillator 90 has a quartz resonator 1, an oscillation signal output section 10 which oscillates the quartz resonator 1 to output an oscillation signal $\phi 1$ having a resonant frequency fc of the quartz resonator 1, a programmable divider (reference divider: RD) 15 which divides (by M) the oscillation signal $\phi 1$ to generate a reference signal $\phi 2$ having a frequency fr, a PLL circuit 20 which operates by being supplied with this reference signal $\phi 2$, a programmable divider (output divider: OD) 30 which divides (by X) a multiplied signal $\phi 3$ output from the PLL circuit 20 and having a frequency fp to generate an output signal $\phi 4$ having a frequency fo, and a buffer 35 which amplifies and outputs the output signal $\phi 4$. The PLL circuit 20 has a phase comparator 21 which compares the phase of reference signal $\phi 2$ supplied from the RD 15 and the phase of a signal fed back from a voltage controlled oscillator (VCO) 23, a low-pass filter (LPF) 22 which cuts off high frequency components of an output of the phase comparator 21 and supplies the cut output to the VCO 23, and the VCO 23 that oscillates so that the phases of the two signals input to the phase comparator 21 coincide with each other. Further, a feedback divider (FD) 24 is provided in a feedback circuit of the PLL circuit. The frequency of an output of the VCO 23 is divided (by N) by the FD 24 to be fed back to the phase comparator 21. Consequently, in the PLL circuit 20, multiplied signal $\phi 3$ formed by multiplying the signal input to the phase comparator 21 by N is output from the VCO 23.

Each of the dividers (frequency dividers) 15, 24, and 30 used in this oscillator 90 is a programmable divider capable of dividing the frequency of the input signal by a set frequency dividing number. Accordingly, in the oscillator 90 shown in FIG. 18, combinations of frequency dividing numbers M, N, and X for the frequencies to be output are previously set in a memory 95, and one of the combinations of the frequency dividing numbers M, N, and X stored in the memory 95 can be selected by a decoder 96 connected to an external input 94. For example, if the oscillator 90 uses a quartz resonator 1 having a resonant frequency fc of 20 MHz, it can select and output one of sixteen different frequencies according to a combination of four external terminals S0, S1, S2, and S3.

Use of a PLL oscillator using such a programmable divider has enabled one oscillator to cover a plurality of frequencies, thus making it possible to provide an oscillator capable of operating as stably as conventional quartz oscillators in the period before a restricted appointed limit of delivery. Recently, however, various requirements have been posed for reference oscillation sources and there has been a need to prepare various types of oscillators even if the above-described PLL oscillator is used. Further, the speed of development of information processors or communication apparatuses have been remarkably accelerated and, therefore, a need for manufacturing oscillators of new specifications or frequencies in a short period has arisen. On the other hand, the operating accuracies of information processors and communication apparatuses have been improved, so that there is a need to also improve the frequency accuracy of signals output from oscillators.

SUMMARY OF THE INVENTION

It is therefore an object of the present invention to provide an oscillator which is capable of outputting an output signal that is stable and accurate in frequency in comparison with conventional PLL oscillators, which can be manufactured in a short period, and which can be supplied at a low cost.

In the conventional PLL circuit, as described above, a quartz resonator having a resonant frequency adjusted with a predetermined degree of accuracy is used and the resonant frequency is multiplied by a predetermined combination of frequency dividing numbers to obtain an output signal of an intended frequency. On the other hand, the inventors of the present invention have found that output signals of various frequencies required by users can be obtained by setting the frequency dividing numbers for dividers to suitable values independent of each other. That is, in an oscillator of the present invention, an output signal of a desired frequency can be obtained by enabling suitable setting of frequency dividing numbers for dividers even if the resonant frequency of a quartz resonator is not adjusted to an ideal value, and high-precision output signals adjusted to various frequencies required by users can be obtained regardless of whether or not they are to be output.

This will be described in more detail with reference to a model case shown in FIG. 1. In FIG. 1, frequencies fp of an output signal (multiplied signal) from a PLL circuit are plotted, frequencies fp being obtained by changing the value of frequency dividing number M for a reference divider RD step by step from 5 to 10 and by changing the value of frequency dividing number N for the FD of the PLL step by step between 1 to 30 with respect to each value of frequency dividing number M. It can be understood that, if the values of frequency dividing numbers M and N can be variably set independent of each other in this manner, various frequencies can be obtained from one resonant frequency fc, as described below. For example, when the frequency dividing number M is 10, frequencies fp of 0.1 fc and 0.2 fc can be obtained. As frequencies between these two frequencies, four frequencies of fc/9, fc/8, fc/7, and fc/6 can be obtained by suitably changing the frequency dividing numbers M and N. Thus, frequencies of the multiplied signal output from the PLL circuit can be set with very fine pitches by using one quartz resonator. It is apparent that the pitches with which frequencies can be set can be made finer by increasing the frequency dividing number M for the reference divider RD. Conversely, even if a quartz resonator whose resonant frequency fc is different from the ideal resonant frequency is employed, a multiplied signal of a desired frequency can also be obtained by suitably setting the frequency dividing numbers M and N.

Thus, the oscillator of the present invention is characterized by comprising a piezoelectric resonator such as a quartz resonator, an oscillation signal output section for oscillating the piezoelectric resonator to output an oscillation signal of a first frequency, a first programmable divider (reference divider: RD) for dividing the frequency of the oscillation signal by a first frequency dividing number (frequency dividing number M) to obtain a reference signal of a second frequency, a PLL circuit section capable of operating by using the reference signal input thereto to obtain a multiplied signal of a third frequency, the multiplied signal being formed by multiplying the input signal by a second frequency dividing number (frequency dividing number N) for a second programmable divider (feedback divider: FD) provided in a feedback circuit, and a setting section capable of variably setting the first and second frequency dividing numbers (frequency dividing numbers M and N) to values independent of each other.

Further, a third programmable divider (output divider: OD) capable of dividing the frequency of the multiplied signal by a third frequency dividing number (frequency dividing number X) may be provided and the setting section may be arranged to variably set the third frequency dividing number (frequency dividing number X) to a value independent of the first and second frequency dividing numbers. In some case, this OD enables the frequency dividing number M for the RD to be set to a smaller number to set the frequency of the reference signal to a higher frequency, thereby preventing deterioration of jitter as described below as well as obtaining an output signal more stable in frequency.

As shown in FIG. 1, since integers are set as frequency dividing numbers M and N for frequency dividing with the programmable dividers, frequencies fp obtained by the PLL circuit are determined digitally (discretely) while the frequency dividing numbers M and N are suitably set. Therefore, it is possible that there is no combination of frequency dividing numbers M and N for setting the obtained frequency within tolerance limits about the desired frequency. Also, there is a frequency band G about a frequency corresponding to an integer multiple of the resonant frequency fc in which no frequency can be set with any setting of frequency dividing number M, N, or X changed variously as possible. If the maximum value of the frequency dividing number M is Mmax, the frequency band G is as defined by ±fc/Mmax. The ranges of frequency bands G corresponding to ranges in which the frequency fp of the multiplied signal cannot be variably set for these reasons can be limitlessly restricted by increasing frequency dividing number M. However, if the frequency dividing number M is increased, the second frequency of the reference signal, i.e., the input signal to the PLL circuit section, becomes so low that the signal obtained by multiplying this input signal while performing phase comparison is liable to deteriorate in accuracy and stability. That is, deterioration of jitter occurs. Therefore, it is desirable to set the frequency dividing number M below such a value that considerable deterioration of jitter is avoided.

In the oscillator of the present invention, therefore, an adjustment circuit capable of finely adjusting the first frequency with respect to the resonant frequency of the piezoelectric resonator is provided in the oscillation signal output section to finely adjust the frequency of the oscillation signal, thereby ensuring that even a signal having a frequency which cannot be covered by only discrete setting of the combination of frequency dividing numbers M and N, or which falls into the frequency band in which no frequency can be set can be output from the oscillator. Moreover, since the frequency dividing number M is limited to a suitable value such that considerable deterioration of jitter cannot occur, an output signal having high frequency accuracy and high stability can be obtained from the oscillator of this embodiment. The amount of adjustment by the adjustment circuit can be set in the setting section together with the frequency dividing numbers M and N. By variably setting these values, any frequency required by a user can be output. Conversely, even if a quartz resonator not adjusted to an ideal resonant frequency is used, a signal of the desired frequency can be output. Thus, there is no need for frequency adjustment of the quartz resonator itself and the oscillator can be set to any frequency required by a user after it has been manufactured, thus facilitating mass-production of the oscillator. As a result, an oscillator capable of obtaining an output signal having a desired frequency with improved stability can be supplied in a very short period at a low cost.

As the adjustment circuit for finely adjusting the resonant frequency of the piezoelectric resonator in the oscillation signal output section, a circuit having a plurality of weighted capacitance arrays may be used. A circuit having a variable-capacitance diode is also available. Each of these circuits enables the adjustment amount to be set as a digital value and therefore enables the adjustment amount to be stored and set in the setting section together with the frequency dividing numbers M and N. To store these frequency dividing numbers M and N, frequency dividing number X, or the adjustment amount in the setting section, a ROM (read only memory) may be used. If a change with time, resetting after setting these values, and enabling the memory to be used with suitable set values for inspection are taken into consideration, it is desirable to use an EPROM, i.e., rewritable ROM, as the above-mentioned ROM. However, the oscillator may have the piezoelectric resonator, the oscillation signal output section, the first programmable divider, the PLL circuit section and the setting section packaged integrally with each other and covered with a mold resin. If the oscillator uses such packaging, the EPROM cannot be irradiated with ultraviolet rays. On the other hand, an EEPROM or the like may be used. In such a case, however, the control system becomes complicated and high-priced. In the oscillator of the present invention, therefore, the arrangement may be such that a plurality of ROMs are provided in the setting section to enable at least the first and second frequency dividing numbers (M and N) or the amount of adjustment to be set in each of the ROMs. Thus, an oscillator can be provided which is simple in structure and low-priced but capable of resetting frequency dividing number M or N, the adjustment amount or the like.

An input section for controlling the operating state of the oscillator may be provided and information designating a function controllable by the input section may be stored in this ROM.

Further, to enable the oscillator to be set so that an output signal of the desired frequency can be obtained after the piezoelectric resonator, the oscillation signal output section, the first programmable divider, the PLL circuit section and the setting section have been packaged integrally with each other, it is desirable that the resonant frequency, i.e., the first frequency of the oscillation signal not yet adjusted by the adjustment circuit, should be measurable. For such an effect, the frequency obtained by setting each of frequency dividing numbers M, N, and X to 1 may be measured. However, it is desirable to provide a bypass circuit for enabling direct measurement of the oscillation signal bypassing the first programmable divider and the PLL circuit section.

Most of frequencies required to be supplied by the oscillator are those based on 32.768 kHz for communication or 33.333 kHz for systematic uses. A rectangular AT cut quartz resonator manufactured to oscillate a fundamental wave at 25.1 MHz produces the base of frequencies for systematic uses when the frequency dividing number M is 753, and the base of communication frequencies within a range in which adjustment can be easily performed by an adjustment circuit of about 10 ppm when frequency dividing number M is 766. Further, this quartz resonator is a resonator which can be manufactured at a low cost, which is free from coupling with spurious vibration, and which has a high yield. Consequently, it can be understood that almost all of the frequencies can be covered by using a quartz resonator of 25.1 MHz.

To set a frequency in the oscillator of the present invention, a method may be used in which, on the basis of the unadjusted resonant frequency measured by using the above-mentioned bypass circuit or the like, the first and second frequency dividing numbers are set to such numbers that the third frequency of the multiplied signal is obtained as a frequency closest to the desired frequency. Then, fine adjustment is performed so that the third frequency becomes equal to the desired frequency. In this manner, the oscillator can be set so as to output a signal having the desired frequency without performing frequency adjustment of the piezoelectric resonator itself. Needless to say, if it is desirable to perform frequency dividing in the third programmable divider (OD), the third frequency may be set to a frequency by considering a frequency dividing number X.

Another method may also be used in which, with respect to the desired frequency, the first and second frequency dividing numbers with which an output signal having the closest third frequency can be obtained are previously calculated on the basis of the ideal resonant frequency of the piezoelectric resonator, and the first frequency is finely adjusted on the basis of the first and second frequency dividing numbers to such a value that the desired frequency is obtained.

Such oscillation frequency setting operation s may be performed solely before the oscillator is mounted on a circuit board. Alternatively, setting operations may be performed after the oscillator has been mounted on a circuit board. Further, frequency setting operations can be performed before, after or simultaneously with the process for inspection using probes connected to the circuit board. If frequency setting operations are performed after mounting the oscillator on a circuit board, the oscillation frequency can be set by reflecting a subtle change in the state of the resonator or the like caused by mounting on the circuit board. If such setting operations are performed before, after or simultaneously with the inspection process, the operation process can also be shortened. In a case of a conventional oscillator in which an oscillation frequency is uniquely determined on the maker side is used, no frequency setting operations are performed on the user side. Similarly, with respect to the oscillator of the present invention, oscillation frequency setting may be performed as steps integral with the sequence of inspection operations. In this manner, the oscillator of the present invention cap able of variably changing the oscillation frequency is assembled and frequency-adjusted by the same number of steps or the same procedure as that for conventional oscillators in which the oscillation frequency cannot be changed.

BRIEF DESCRIPTION OF THE DRAWINGS

FIG. 5 is a table showing a part of the examples of frequency dividing members M, N, and X which can be set in the oscillator shown in FIG. 2.

FIGS. 11(a)–(c) are diagrams showing another example of the oscillator of the present invention, FIG. 11(a) being a cross-sectional view in a direction along a plane, FIG. 11(b) being a longitudinal cross-sectional view, FIG. 11(c) being a cross-sectional view in a lateral direction.

FIG. 19 is a diagram showing frequencies each of which can be output from the oscillator shown in FIG. 18.

DETAILED DESCRIPTION OF PREFERRED EMBODIMENTS

Figure 2:
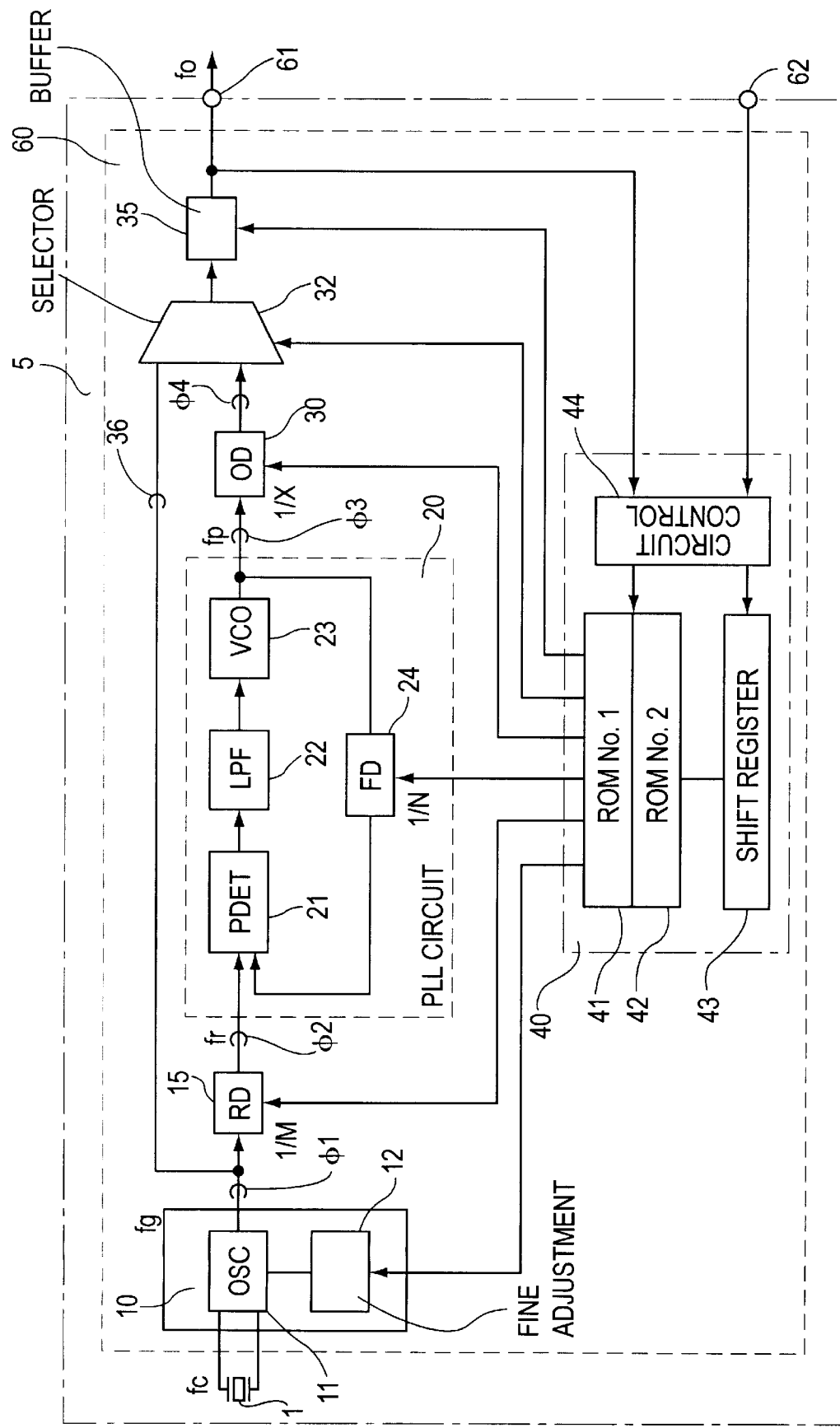
FIG. 2 is a block diagram schematically showing the configuration of an oscillator which represents an embodiment of the present invention.
Figure 18:
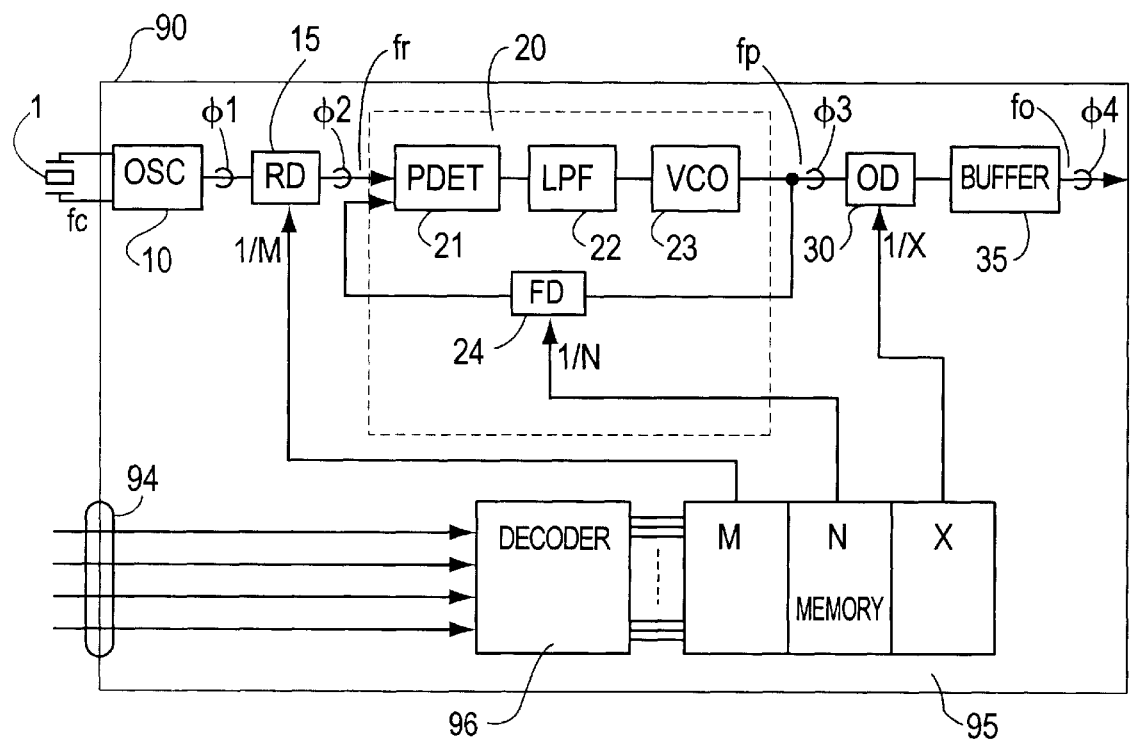
FIG. 18 is a block diagram showing an example of a conventional oscillator.

Embodiments of the present invention will be described below with reference to the drawings. FIG. 2 shows an embodiment of an oscillator using a PLL circuit of the present invention. The oscillator 5 of this embodiment also outputs an output signal φ4 having a predetermined frequency to by oscillating a quartz resonator 1 and by performing multiplication in the PLL circuit. Portions corresponding to those of the oscillator described with reference to FIG. 18 are indicated by the same reference numerals and detailed description for them will not be repeated. In the oscillator 5 of this embodiment, an oscillation signal output section 10, which oscillates the quartz resonator 1, has, in addition to an oscillation circuit 11, an adjustment circuit 12 capable of changing a frequency fg of an oscillation signal φ1 by finely adjusting a resonant frequency fc of the quartz resonator 1. The frequency of the oscillation signal φ1 finely adjusted is divided by M by a reference divider (RD) 15, which is a programmable divider, to form a reference signal φ2 having a frequency fr. Reference signal φ2 is supplied to a PLL circuit 20. The PLL circuit 20 operates by being supplied with the reference signal φ2 and outputs a multiplied signal φ3 which is obtained by multiplying the reference signal φ2 by a frequency dividing number N by a feedback divider (FD) 24 provided as a programmable divider in a feedback circuit, and which has a frequency fp. This multiplied signal φ3 is further divided by X by an output divider (OD) 30, which is a third programmable divider, to form an output signal φ4 having a frequency fo. Output signal φ4 passes a selector 32 and a buffer 35 to be output through an output terminal 61. The selector 32 is for changing the output signal φ4 and a bypass circuit 36 for directly outputting through the output terminal 61 the oscillation signal φ1 output from the oscillation signal output section 10. The selector 32 is controlled by a setting section 40 described below. Further, the buffer 35 has a function of buffering and amplifying, and outputting the output signal φ4 and thereafter outputting the amplified signal, and a function of setting the output terminal in a high-impedance state according to an operation mode of the oscillator.

These dividers RD 15, FD 24, and OD 30, the adjustment circuit 12, and so on are supplied with frequency dividing numbers M, N, and X, an adjustment amount, and so on. The setting section 40 of this embodiment has ROMs 41 and 42 forming two stages, and a shift register 43 capable of converting input serial data into parallel data to write the data in each of the ROMs 41 and 42. This shift register 43 is also used to temporarily set an amount of adjustment performed by the adjustment circuit 12 or to temporarily set the frequency dividing numbers M, N, and X. The setting section 40 further has a control circuit 44 which controls the buffer 35 and the selector 32 through the ROMs 41 and 42 and controls writing of data to the ROMs 41 and 42. Selection of control modes of the control circuit 44 is performed through a control terminal 62. For example, to write data to the ROM 41 or ROM 42 through the shift register 43, the output terminal 61 is used as a data input terminal. Accordingly, at the time of data writing, the buffer 35 is closed and data input from the output terminal 61 is sent to the shift register 43 via the control circuit 44 and is converted into parallel data to be written to the ROM 41 or 42. In the oscillator 5 of this embodiment, therefore, no decoder is provided and values freely set independent of each other can be stored in the ROM 41 or 42 as frequency dividing numbers M, N, and X and an adjustment amount, and the values can be changed freely. Needless to say, predetermined combinations of frequency dividing numbers M, N, and X and adjustment amounts can be externally loaded as data in the ROM 41 or 42. In the oscillator 5 of this embodiment, such combinations are not exclusively used, and frequency dividing numbers M, N, and X and the adjustment amount can be set to various values freely and independently according to one's need.

The ROMs 41 and 42 can be used by being changed by the control circuit 44. The PLL circuit and the dividers operate with set values stored in the ROM 41 or 42. Each of the ROMs 41 and 42 of this embodiment has such a capacity as to be able to store all data necessary for controlling the oscillator 5 of this embodiment, e.g., frequency dividing numbers M, N, and X, and adjustment amounts. If a change in the resonant frequency fc of the quartz resonator results as a change with time or the like, or in a case where the oscillator 5 of this embodiment is used as an oscillation source for a signal of a frequency different from a frequency initially set, frequency dividing numbers M, N, and X, the adjustment amount, and so on can be reset.

Needless to say, use of the ROMs 41 and 42 is not limited to this. For example, they may also be used to enable a maker to collectively perform inspections requiring special skills with respect to characteristics of the oscillator by writing inspection data to the ROM 41 on the maker side. Objects of such inspections are PLL lockup characteristic, the relationship between the power supply voltage and the rise time of oscillation, and so on. It is difficult for a user to perform such inspections for reasons relating to the equipment and techniques. It is, therefore, desirable that such inspections should be performed on the maker side by specialist engineers using inspection apparatuses having high-performance measuring ability.

In the oscillator 5 of this embodiment, even if the ROM 41 is used to perform such inspections, the other ROM 42 can be freely used on the user side. Accordingly, only good articles which have passed inspections are shipped from a maker, and data corresponding to certain requirements is written to the ROM 42 at a business station or by a user. Since there is no need to again inspect the items inspected on the maker side, simpler inspections will suffice on the business station or user side.

Further, in the oscillator 5 of this embodiment, since the ROMs 41 and 42 are used as a set value storage medium, one of functions OE, ST and STZ controllable through the control terminal 62 in functions capable of controlling the operating state of the oscillator 5 can be set in the ROMs. The OE (output enable) function is a function for setting the output signal φ4 in a high-impedance state while operating the oscillation circuit for quartz resonator 1 and the PLL circuit. This function is used at the time of an operation test of a computer or the like. The ST (standby) function is a function for fixing the output signal φ4 at a high level or low level by setting the oscillation circuit and the PLL circuit in a stopped state. This function is effective in saving energy in a computer or the like. The STZ function is a function based on a combination of the two functions, i.e., a function for setting the output signal φ4 in a high-impedance state while stopping the oscillation circuit and the PLL circuit. Therefore, this function can be used at the time of an operation test when a computer is manufactured and at the time of energy saving. Further, data for setting the duty of a signal output from the output terminal 61 as desired is stored in the ROMs 41 and 42.

Figure 3:
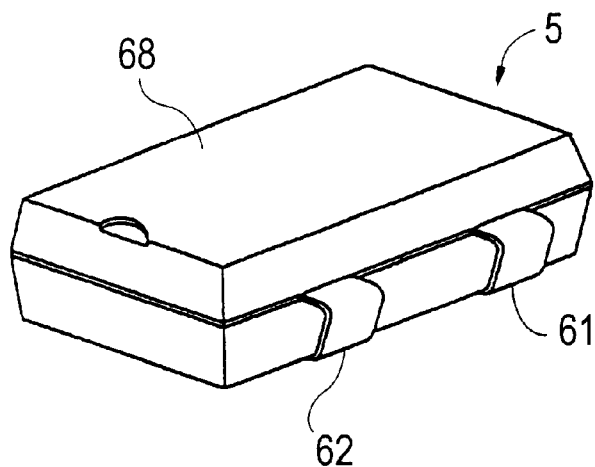
FIG. 3 is a perspective view of an external appearance of the oscillator shown in FIG. 2.
Figure 4:
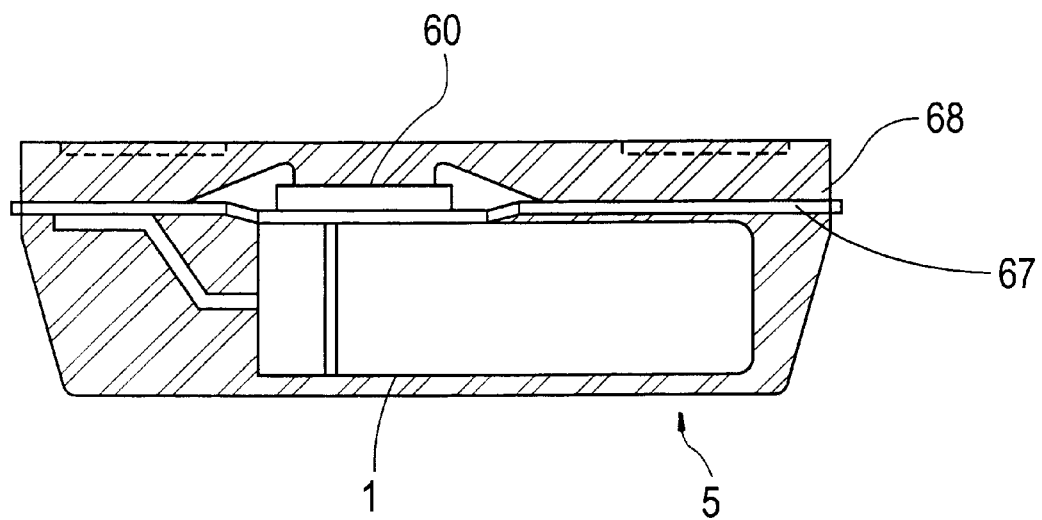
FIG. 4 is a diagram showing the internal structure of the oscillator shown in FIG. 3 with a mold partially removed.

In the oscillator 5 of this embodiment, the oscillation signal output section 10, the divider RD 15, the PLL circuit 20, the divider OD 30, the selector 32, the buffer 35 and the setting section 40 are combined in one chip forming an IC 60. This IC 60 and quartz resonator 1 are packaged by molding. FIG. 3 shows an external appearance of the oscillator 5 of this embodiment in a state of being packaged with a mold resin 68, and FIG. 4 shows the internal structure of the oscillator with mold resin 68 partially removed. In the oscillator 5 of this embodiment, IC 60 is mounted on one of two surfaces of a lead frame 67 while quartz resonator 1 enclosed in a cylinder is mounted on the other surface of the lead frame 67. These are packaged integrally with each other with mold resin 68, the output terminal 61, and the control terminal 62, that is also used as an essential terminal for the oscillator appearing outside the package. The terminal for writing data may be provided so as to be also used as an essential terminal for the oscillator or may be provided for its special function only. Even if an EPROM is used as ROM 41 or 42, it is covered with mold 68 and cannot be irradiated with ultraviolet rays since the ROMs 41 and 42 are packaged. An EEPROM or the like may be used. In such a case, however, the control circuit 44 becomes further complicated and the ROM is high-priced. In contrast, if ROMs 41 and 42 in two arrays having a sufficiently large capacity are prepared like those in the oscillator 5 of this embodiment, ROMs 41 and 42 can be used by being changed and it is possible to reliably rewrite or change set values including frequency dividing numbers at a low cost.

In the oscillator 5 of this embodiment, a rectangular AT cut quartz resonator manufactured so as to oscillate a fundamental wave at 25.1 MHz is used as quartz resonator 1. This quartz resonator is the most stable one of piezoelectric resonators considering physical and chemical changes, and even changes with time. It is possible to realize an oscillator having improved reliability by using a quartz resonator. Further, the vibrating piece may be formed into a rectangular shape to be more compact than disk-like vibrating pieces, thereby enabling the oscillator to be reduced in size. Since a rectangular AT cut quartz resonator for oscillation of a fundamental wave at 25.1 MHz can be realized, oscillation can be achieved with improved stability in comparison with oscillation of resonators having resonant frequencies higher than 30 MHz and oscillating in overtones.

Figure 1:
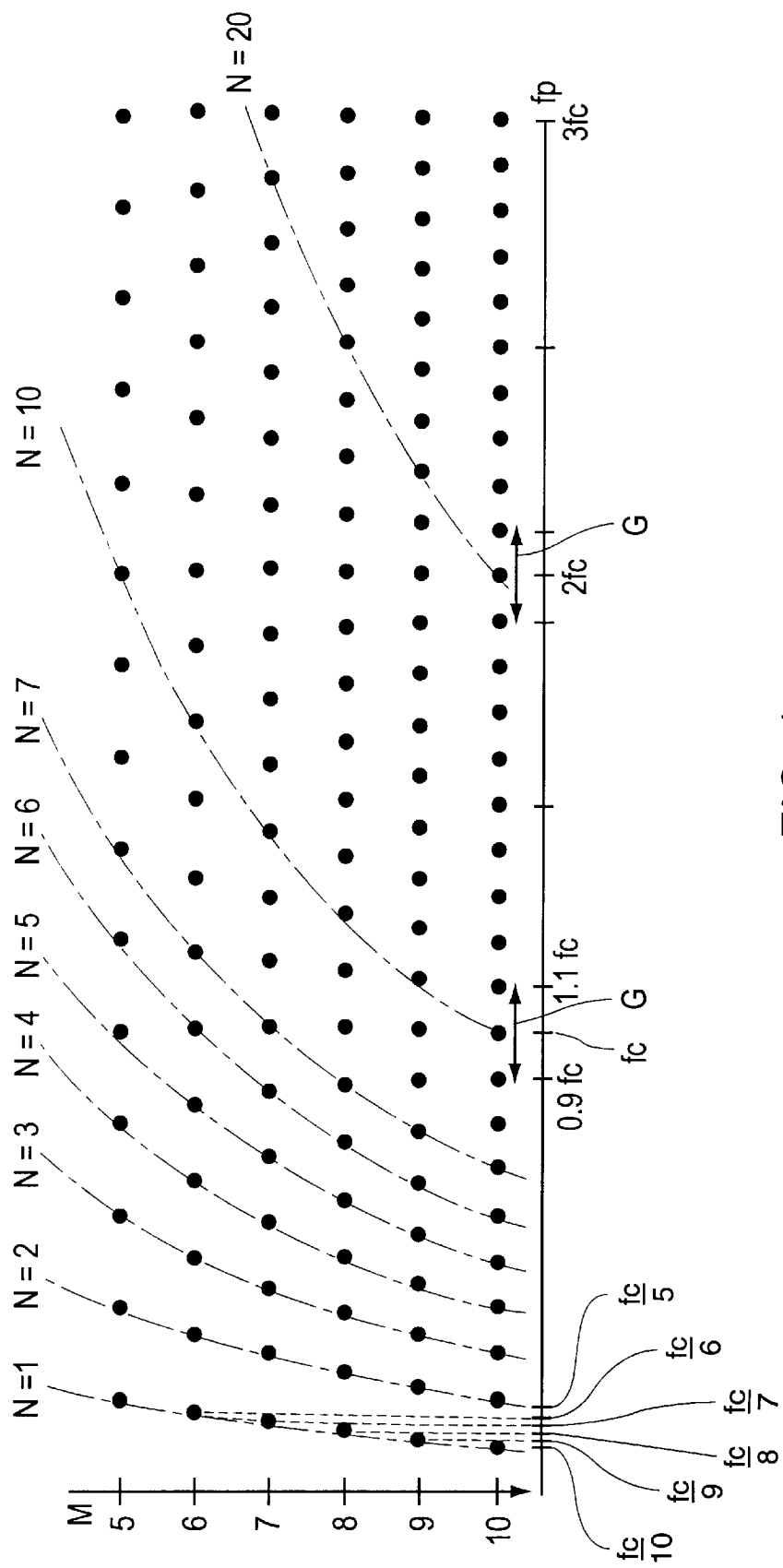
FIG. 1 is a diagram showing is a model of a frequency distribution of a signal producible by an oscillator of the present invention.

Further, since the quartz resonator 1 of this embodiment is a quartz resonator oscillating a fundamental wave, its frequency variable range is very wide and the frequency of oscillation signal $\phi 1$ can be set in a wide range by the adjustment circuit 12 of the oscillation signal output section 10. In the oscillator 5 of this embodiment, frequency dividing numbers M and N are digital values, as described above with respect to the model shown in FIG. 1. Therefore, the frequency fp obtained by the PLL circuit 20 is a discrete value even if the frequency dividing numbers M and N are changed. Also, a frequency band G which has a predetermined width and in which no frequency can be set exists about each of frequencies corresponding to integer multiples of frequency fg of the oscillation signal $\phi 1$ or frequency fc even if the frequency dividing numbers M and N are changed. On the other hand, the quartz resonator 1 of this embodiment has a wide frequency variable range such that the amount of adjustment performed by the adjustment circuit 12 can be increased. Therefore, even in a case where a predetermined frequency fo cannot be obtained according to the combination of the frequency dividing numbers M and N, output signal $\phi 4$ having the predetermined frequency fo can be reliably generated by finely adjusting the frequency of the oscillation signal $\phi 1$ on the adjustment circuit 12 side.

Further, while resonators of 20 MHz or lower require convex working for confining energy, the 25.1 MHz resonator of this embodiment can be realized in a rectangular form. Thus, a high-quality resonator can be provided at a low cost. Moreover, since there is no coupling with spurious vibrations in a wide range about 25.1 MHz, the yield is high. Also for this reason, a low-priced high-quality resonator can be provided. The oscillator 5 of this embodiment can generate output signals having various frequencies by variably setting the frequency dividing numbers M, N, and X to suitable values and can therefore be adapted generally to all frequencies presently required by users if such a high-quality, small, low-priced quartz resonator 1 is used as an oscillation source. Most of frequencies presently in demand are those based on 32.768 kHz for communication or 33.333 kHz for systematic uses. A rectangular AT cut quartz resonator manufactured to oscillate a fundamental wave at 25.1 MHz produces the base of frequencies for systematic uses when the frequency dividing number M is 753, and the base of communication frequencies within a range in which adjustment can be easily performed by an adjustment circuit of about 10 ppm when the frequency dividing number M is 766. Consequently, it can be understood that almost all of the frequencies can be covered by using a quartz resonator of 25.1 MHz.

FIG. 5 shows cases of combinations of frequency dividing numbers M, N, and X usable in the oscillator 5 of this embodiment to obtain an output signal $\phi 4$ having frequency fo of 16 MHz by using a quartz resonator 1 having resonant frequency fc of 25.1 MHz. As can be understood from this table, a frequency having a deviation of about several 10's to several 100's ppm from 16 MHz set as a target can be obtained with the oscillator 5 of this embodiment by setting suitable frequency dividing numbers M, N, and X about the combination of frequency dividing numbers M, N, and X shown as cases 4, 5 or 6. Conversely, in a case where the quartz resonator 1 having a deviation of about several 10's to several 100's ppm from the ideal resonant frequency of 25.1 MHz is used, these frequency dividing numbers M and N may be set in the ROM 41 or 42 to obtain the desired 16 MHz output signal $\phi 4$. Thus, in oscillators 5 of this embodiment, each of the resonators in the state of having excitation electrodes attached to a vibrating piece may be directly used by setting the frequency diving numbers M and N suitable for the resonant frequency of the resonator to obtain an output signal $\phi 4$ having the desired frequency fo without specially adjusting the resonant frequency of the quartz resonator 1 to the ideal target value, e.g., 25.1 MHz with accuracy. Therefore, the need for operations of weight removal and weight addition for frequency adjustment can be eliminated and troublesome steps using such operations can be removed. Simultaneously, the problem of a deterioration in characteristics or a frequency shift due to a position error or unbalance resulting from weight removal or weight addition can be solved. Further, it is possible to absorb an error in frequency due to a variation in circuit constants of the oscillation circuit 11 or the like by selecting a suitable frequency in each oscillator 5. As a result, the oscillator 5 of this embodiment can obtain an output signal highly accurate and stable in frequency without requiring substantially troublesome operations in manufacture, assembly and adjustment.

Since the values of frequency dividing numbers M, N, and X selectable in the oscillator 5 of this embodiment are integers, the obtained frequency fo has a discrete value. Conversely, with respect to a certain value of the resonant frequency of the quartz resonator 1, there is a possibility of failure in finding suitable integer values as the frequency dividing numbers M, N, and X. Also, in some case, with respect to a certain value of the desired frequency fo, there is a possibility of an occurrence of the above-mentioned frequency band G about a frequency corresponding to an integer multiple of the resonant frequency fo in which adjustment cannot be performed even if the frequency dividing number M, N, or X are changed. On the other hand, if the frequency dividing number M for RD 15 for forming reference signal $\phi 2$ is increased, cases in which adjustment cannot be performed are effectively reduced, as described above with reference to FIG. 1. However, if the frequency dividing number M is increased, a deterioration of jitter of the multiplied signal $\phi 3$ obtained by the PLL circuit 20 is also increased, as described above. Therefore, it is desirable that, with respect to the resonant frequency fc of the quartz resonator, a combination of frequency dividing numbers M, N, and X be selected such that frequency dividing number M is minimized. In this embodiment, to cope with such cases, the adjustment circuit 12 capable of finely adjusting the frequency fg of the oscillation signal with respect to the resonant frequency fc obtained by the oscillation circuit 11 is provided in the oscillation signal output section 10. In a case where the maximum value Mmax of the frequency dividing number M is set to, for example, 800, it is desirable that, by considering occurrence of a frequency band G of 1250 ppm about the resonant frequency fc in which the desired frequency cannot be set by changing the frequency dividing numbers M and N, the range in which the frequency can be adjusted by the adjustment circuit 12 should be selected such that the adjustment circuit 12 can perform fine adjustment to such a maximum extent as to cover the frequency band G at the maximum. Alternatively, a suitable integer, e.g., 2 or 3 may be set as the frequency dividing number X for the OD 30 to reduce the width of the frequency range in which the desired frequency setting cannot be performed to ½ or ⅓, thereby restricting the range in which adjustment should be performed by the adjustment circuit 12 in connection with the oscillator circuit 11.

Figure 6:
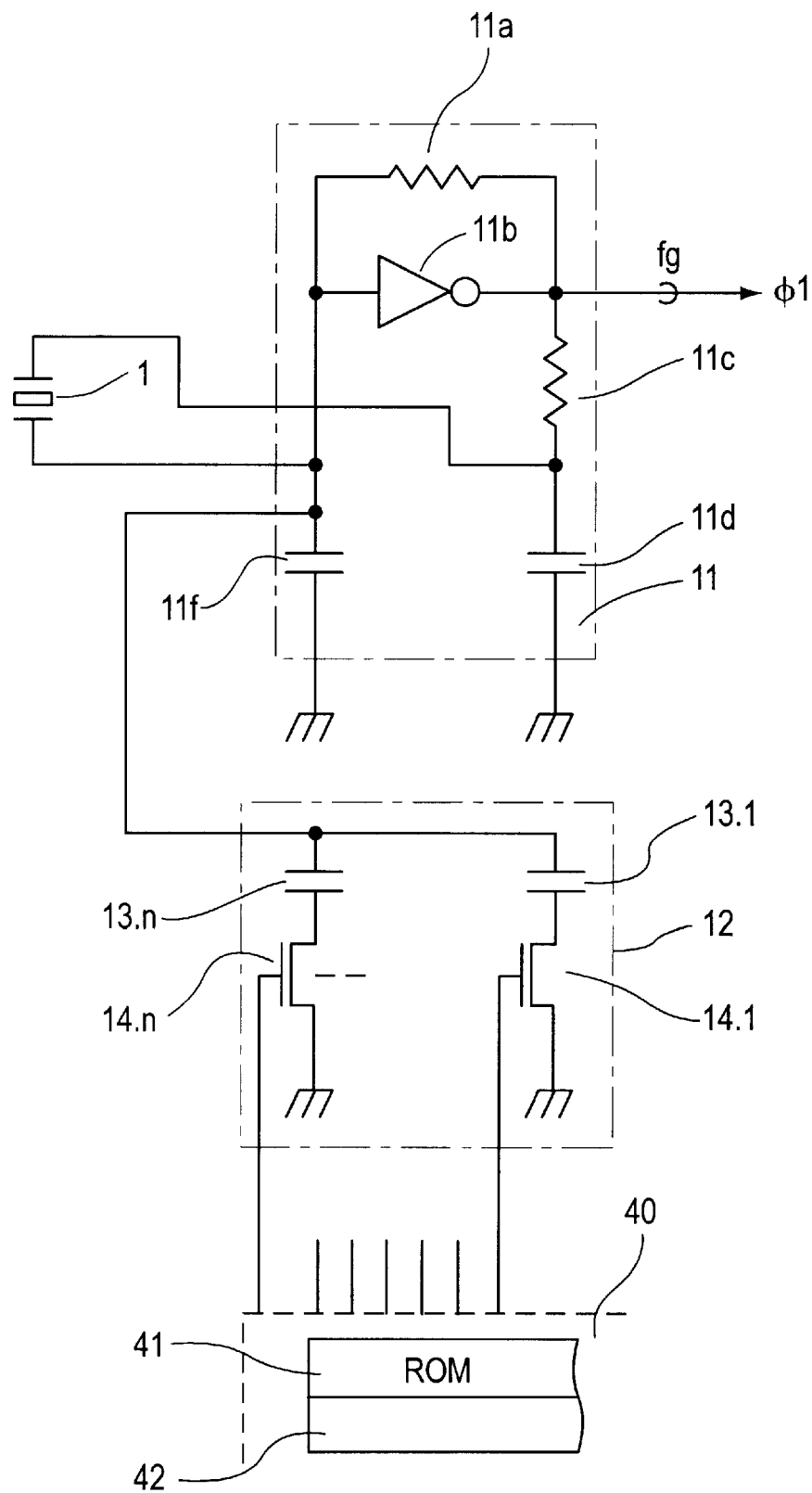
FIG. 6 is a diagram showing an adjustment circuit using capacitance arrays.
Figure 7:
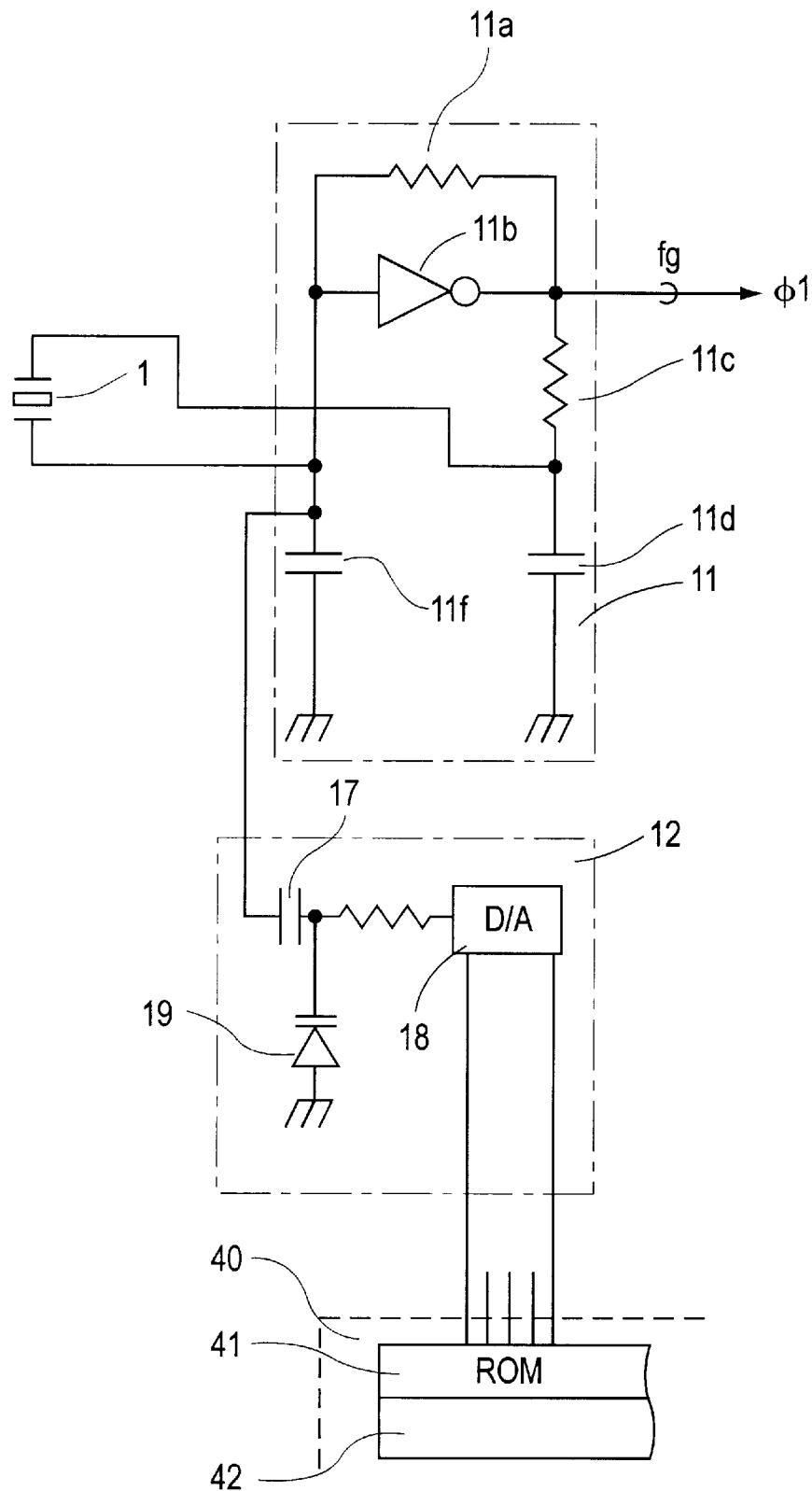
FIG. 7 is a diagram showing an adjustment circuit using a variable-capacitance diode.

FIGS. 6 and 7 show examples of the adjustment circuit 12. The oscillation circuit 11 has an inverter 11b, a feedback resistor ala, a drain resistor 11c, a drain capacitance lid, and a gate capacitance 11f, and is arranged so as to be able to adjust the frequency fg of oscillation signal φ1 by changing the capacitance of the gate capacitance 11f by means of the adjustment circuit 12. Accordingly, in the adjustment circuit 12 shown in FIG. 6, n weighted capacitance arrays 13.1 to 13.n are connected in parallel with the gate capacitance of, and transistor switches 14.1 to 14.n respectively connected to the capacitance arrays 13.1 to 13.n are turned on or off to variably set the capacitance of the gate capacitance 11f. The amount of adjustment is stored in the ROM 41 or 42 of the setting section 40 as digital data for turning on or off the transistor switches 14.1 to 14.n. In the example of the adjustment circuit 12 shown in FIG. 7, a variable-capacitance diode 19 is used. The capacitance of the variable-capacitance diode 19 connected to gate capacitor of via a capacitor 17 is controlled in a digital manner through a D/A converter 18. The amount of adjustment by the variable-capacitance diode 19 is stored in the ROM 41 or 42 of the setting section 40 as is that in the former example.

Figure 8:
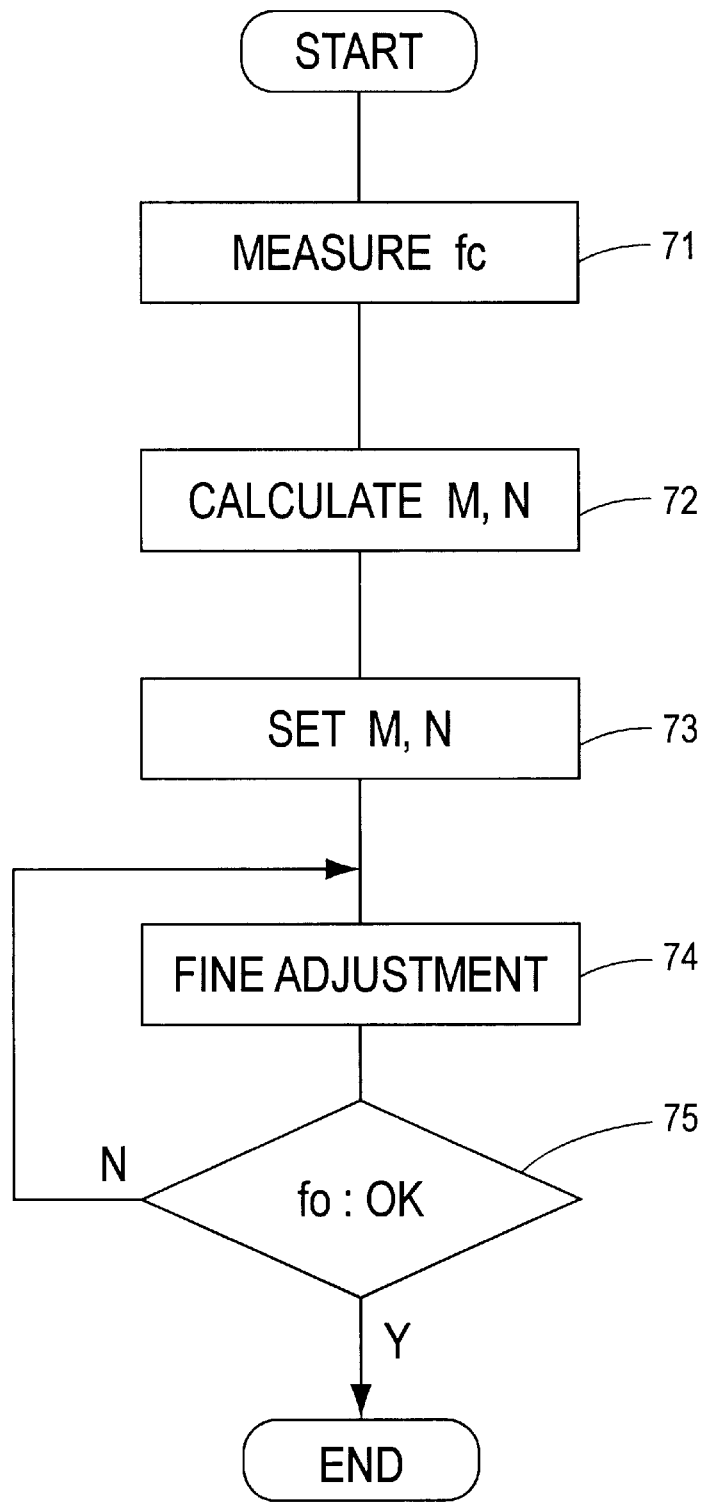
FIG. 8 is a flowchart showing an example of the process of setting a frequency of the oscillator shown in FIG. 2.
Figure 9:
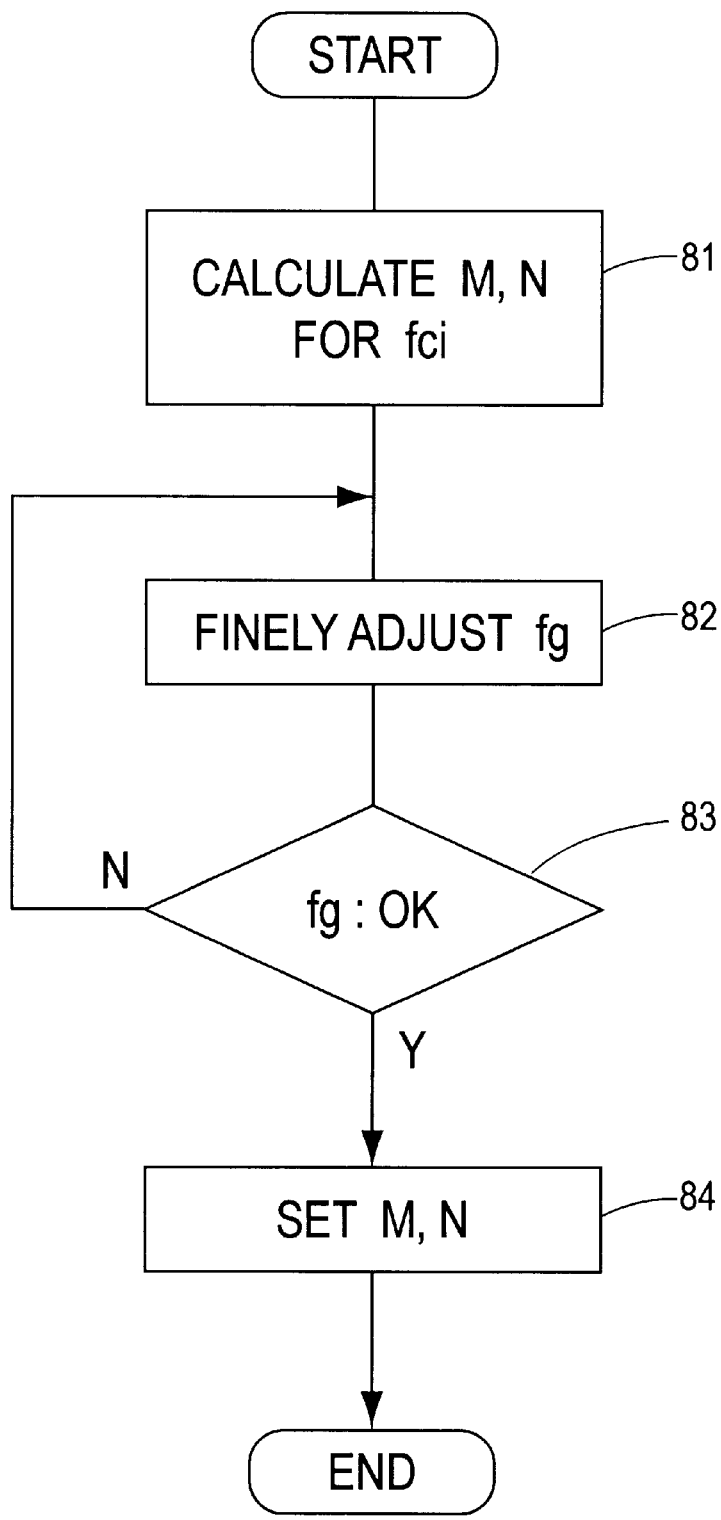
FIG. 9 is a flowchart showing another example of the process of setting a frequency of the oscillator shown in FIG. 2.

FIGS. 8 and 9 show methods of setting the frequency fo of the output signal φ4 of the oscillator 5 of this embodiment to a desired value. In the frequency setting method shown in FIG. 8, the resonant frequency fc of quartz resonator 1 in an unadjusted state is first measured in step 71. In the oscillator 5 of this embodiment, the bypass circuit 36 is provided for this measurement. The signal of resonant frequency fc can be measured through the external terminal 61 by oscillating the quartz resonator 1 in a state where adjustment is not performed by the adjustment circuit 12. The resonant frequency fc can also be measured by setting each of the frequency dividing numbers M, N, and X for the dividers RD 15, FD 24 and OD 30 to 1 by using the shift register 43 of the setting section 40. This measurement can be performed without using the bypass circuit 36. The arrangement using the bypass circuit 36 to enable the resonant frequency to be immediately measured is particularly effective in grasping the quality of the frequency source, analyzing a defect, and the like. Next, in step 72, suitable frequency dividing numbers M and N are calculated from the value of resonant frequency fc and the desired output frequency fo. If necessary, the frequency dividing number X is also calculated simultaneously. At this time, to prevent deterioration of jitter, a method may be used, for example, a method in which the smallest possible value of the frequency dividing number M is selected within a range such that the desired adjustment can be performed by the adjustment circuit 12, or a method in which the frequency dividing number M is selected by being brought close to a limit value to minimize the amount of adjustment. In the oscillator 5 of this embodiment, there is no need for determining a unique combination of frequency dividing numbers M, N, and X with respect to the frequency fo of the output signal, and the frequency dividing numbers M and N can therefore be determined under conditions according to a user's purpose or the like.

After frequency dividing numbers M and N have been determined, the frequency dividing numbers M and N and so on are set in the shift register 43 or the like in step 73. While the frequency fg of oscillation signal φ1 is being finely adjusted by the adjustment circuit 12 in step 74, a check is made in step 75 as to whether the desired value of the frequency fo of output signal φ4 has been obtained. Steps 74 and 75 are repeated until the desired frequency is obtained. If this frequency setting method is used, the frequency adjustment step for bringing the resonant frequency of quartz resonator 1 closer to a certain ideal value can be removed from the process of manufacturing quartz resonator 1. Thus, a quartz resonator supplied in a short period at a low cost can be used in the oscillator 5 of this embodiment. Moreover, in the oscillator 5 of this embodiment, frequency dividing numbers M, N, and X and an adjustment amount can be suitably determined according to the resonant frequency fc of the quartz resonator 1 and the frequency fo required by a user, and can be variably set to independent values. There is no need to select frequency dividing numbers M, N, and X and an amount of adjustment from combinations prepared in a memory, which operation has been necessary with respect to conventional oscillators. Consequently, the oscillator of this embodiment can be shipped after being packaged with IC 60 and quartz resonator 1, molded, and after being set to a frequency required by a user. Therefore, it is possible to produce oscillators to meet a prospective demand no matter what frequencies are required by users. Thus, the form of the oscillator 5 of this embodiment is markedly suitable for mass production. Thus, the oscillator 5 of any frequency required by users can be supplied in a short period at a low cost.

The frequency setting method shown in FIG. 9 is a method for adjusting oscillation of quartz resonator 1 at the resonant frequency fc by the control adjustment circuit 12 to set the oscillation frequency fg at the output point of the oscillation circuit 11 to the ideal frequency of the quartz resonator 1, or to set it to a frequency necessary when frequency dividing numbers M, N, and X are set to a predetermined combination of values with respect to the frequency fo required by a user.

Figure 10:
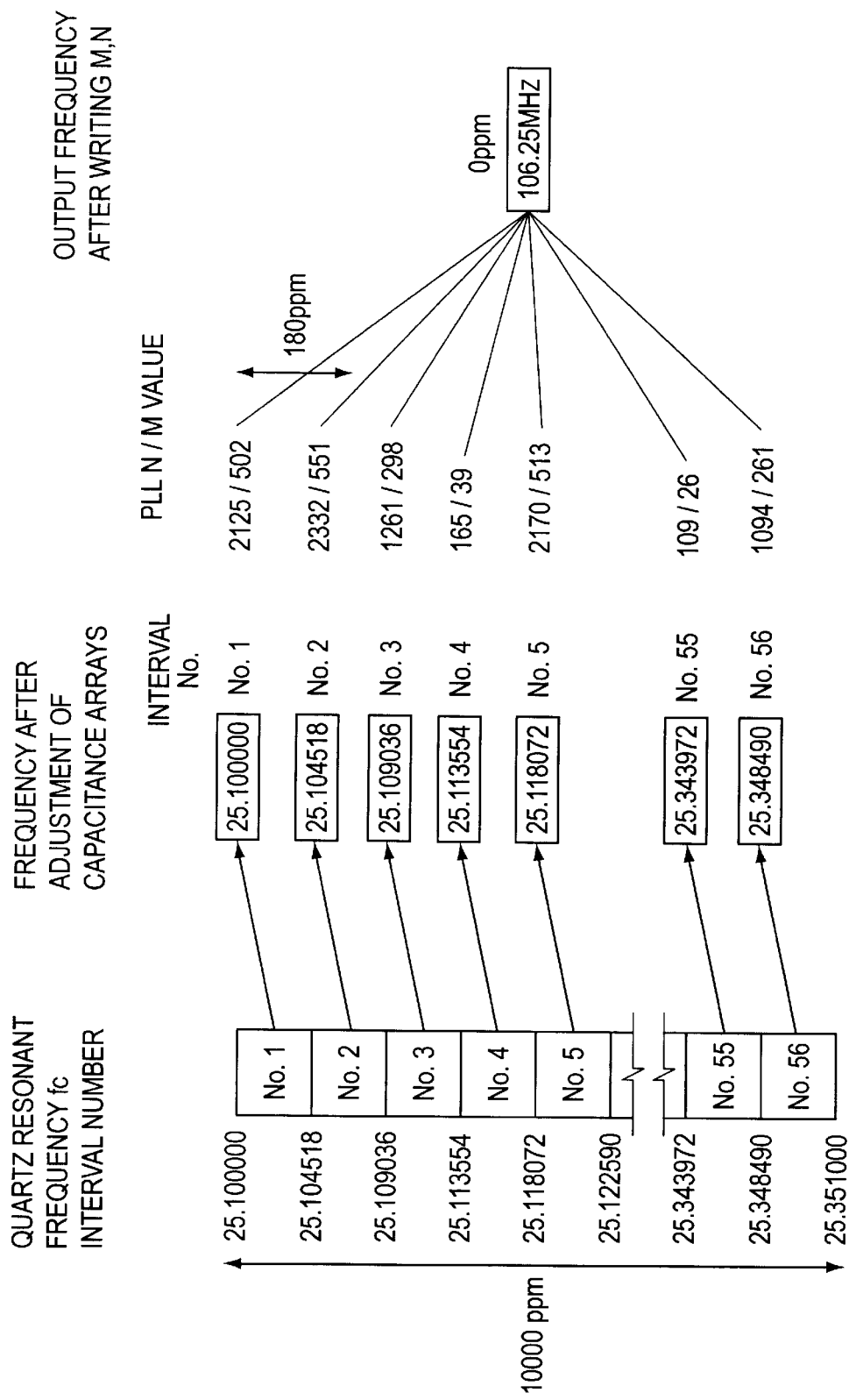
FIG. 10 is a diagram showing an example of frequency setting according to the method shown in FIG. 9.

First, in step 81, frequency dividing numbers M, N, and X most favorable in obtaining the desired output frequency fo on the basis of the ideal quartz resonator frequency fci without a tolerance are determined. FIG. 10 shows an example of the case of obtaining 106.25 MHz as the desired output frequency fo when the resonant frequency fe of the quartz resonator has a variation of about 10000 ppm from 25.100000 to 25.351000 MHz. The original resonant frequency fc can be obtained from the oscillation frequency (resonant frequency) fg in the unadjusted state by setting the bypass circuit 36 or all the frequency dividing numbers to 1. In the case shown in FIG. 10, the range from 25.100000 to 25.351000 MHz is divided into 56 intervals with a 180 ppm pitch such that the frequency is suitably adjustable with the capacitance arrays. From the obtained resonant frequency fc, the interval to which the resonator corresponds is determined. If the obtained resonant frequency fc is 25.105 MHz, the quartz resonator corresponds to the interval 2.

Next, in step 82, the capacitance arrays are adjusted so that the oscillation frequency fg becomes equal to a frequency representing the interval 2, i.e., a frequency of 25.104518 MHz at which M and N suitable for obtaining the output frequency fo are determined. In step 83, this frequency fg is identified. Steps 82 and 83 are repeated until the oscillation frequency fg becomes equal to the above-mentioned frequency of 25.104518 MHz representing the interval 2.

When the oscillation frequency representing the interval is obtained, the combination of frequency dividing numbers M, N, and X previously computed, i.e., the combination of M=551, N=2332 and X=1, is set in the ROM. As a result, output signal φ4 of the desired frequency fo (106.25 MHz in this example) is obtained in accordance with the above-described relationship, i.e., the relationship shown by the following equation (1):

$$fo = fg \times (N/M)/X \qquad (1)$$

The oscillator 5 in which quartz resonator 1 and IC 60 are packaged with mold resin 68 in the state of being superposed on each other in the direction of thickness with lead frame 67 interposed therebetween has been described by way of example. Needless to say, the package of the oscillator 5 is not limited to such a package. Quartz resonator 1 and IC 60 may be packaged by using a mold resin while being placed adjacent to each other along a plane, as shown in FIGS. 11(*a*)–(*c*), thereby providing a thinner oscillator 5.

Figure 12:
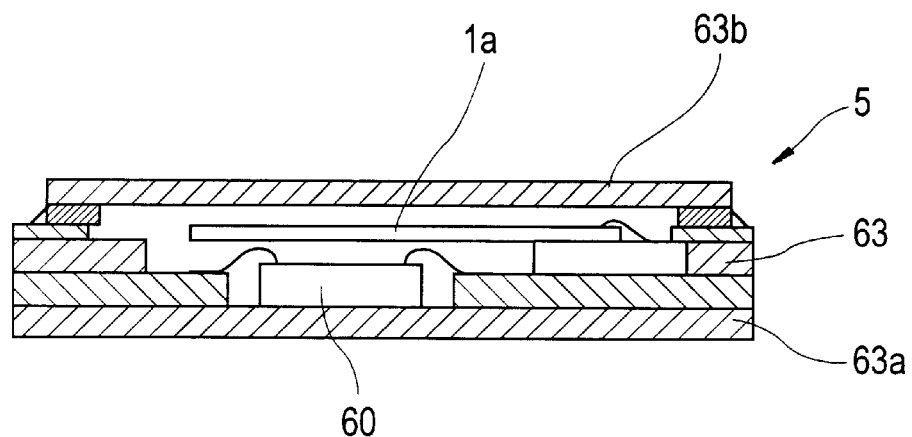
FIG. 12 is a diagram showing an oscillator using a ceramic case, which is still another example of the oscillator of the present invention.

Further, another oscillator 5 may be supplied which uses, as shown in FIG. 12, a ceramic case 63 in which IC 60 is accommodated in a ceramic base 63*a*, and a vibrating piece la of a quartz resonator is accommodated in a cantilevered state, and which is thereafter capped with a ceramic or metallic lid 63*b*. Since there is no need for a special case for accommodating the vibrating piece la in this oscillator 5, an oscillator 5 further reduced in size and thickness in comparison with those described above can be provided.

Figure 13:
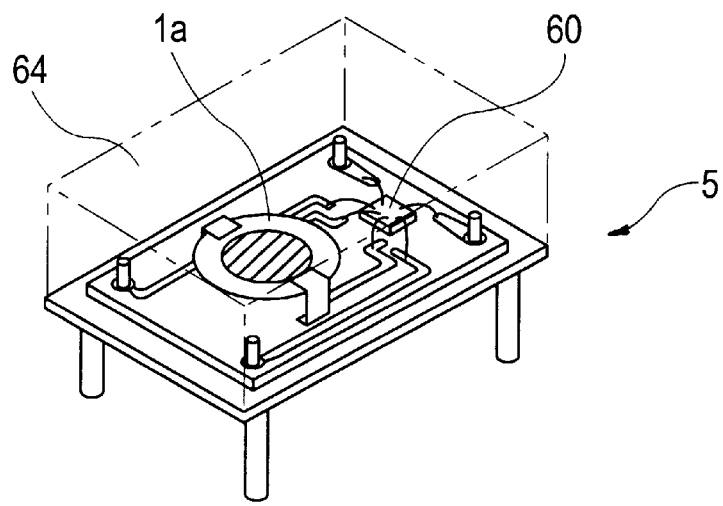
FIG. 13 is a diagram showing an oscillator using a metallic case, which is a further example of the oscillator of the present invention.

Needless to say, an oscillator 5 having a vibrating piece la and IC 60 accommodated in a metallic case 64 as shown in FIG. 13 may also be provided. The type of oscillator using such metallic case 64 is well known. The oscillator 5 of this embodiment of the present invention can also be realized as such a conventional type.

Figure 14:
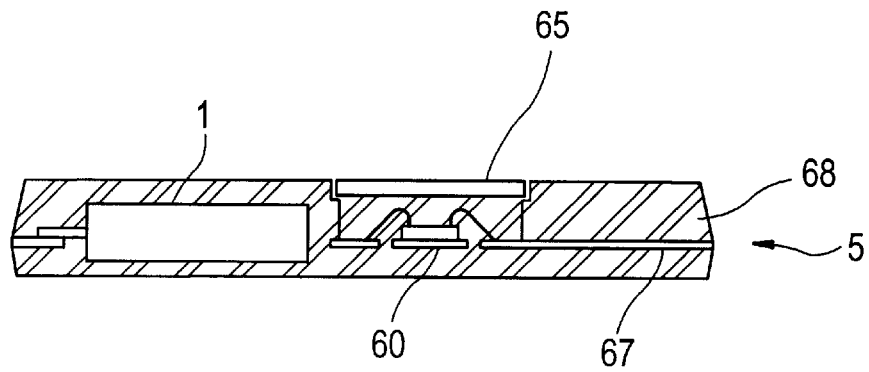
FIG. 14 is a diagram showing an ultraviolet erase type oscillator, which is a further example of the oscillator of the present invention.

Further, as shown in FIG. 14, a transmission window 65 formed of a glass or the like for transmission of ultraviolet rays may be provided at a position corresponding to the IC 60 at the time of packaging, thereby enabling use of the IC 60 incorporating an EPROM capable of erasing recorded data with ultraviolet rays. In this manner, an oscillator 5 can be provided in which data in a ROM can be used by being rewritten if a design change is made according to a user's need, and which can be used more flexibly. The method of erasing data by using ultraviolet rays does not require any special skill, is free from the risk of impairing other functions of the oscillator in contrast with data erasing method using electrical means, and therefore enables reliable processing.

Figure 15A:
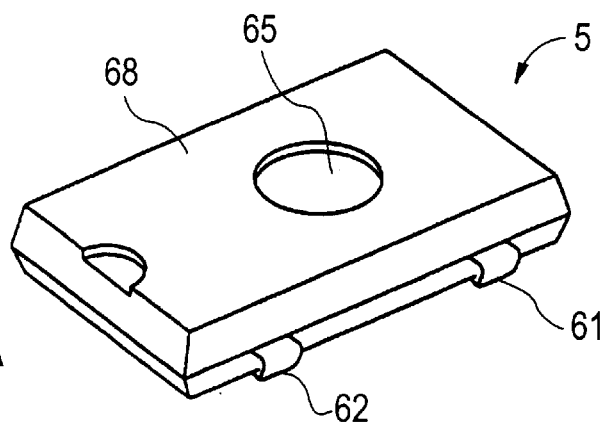
FIG. 15(a) is a diagram showing a state where t he oscillator shown in FIG. 14 is realized as SMD.
Figure 15B:
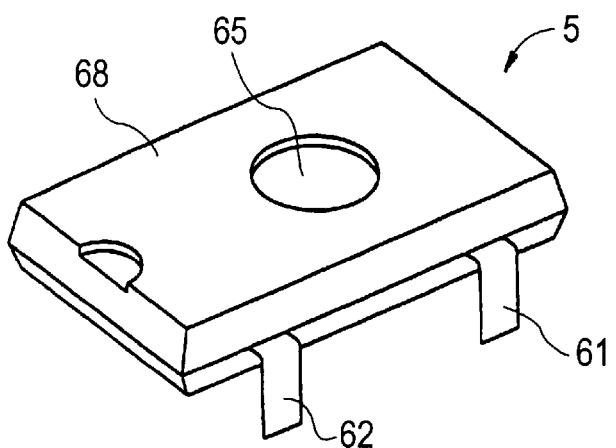
FIG. 15(b) is a diagram showing a state where it is realized as DIP.

An oscillator 5 provided by such a packaging method can also be realized as a surface mount type device (SMD) such as shown in FIG. 15(*a*) or a dip type (DIP) such as shown in FIG. 15(*b*).

Figure 16:
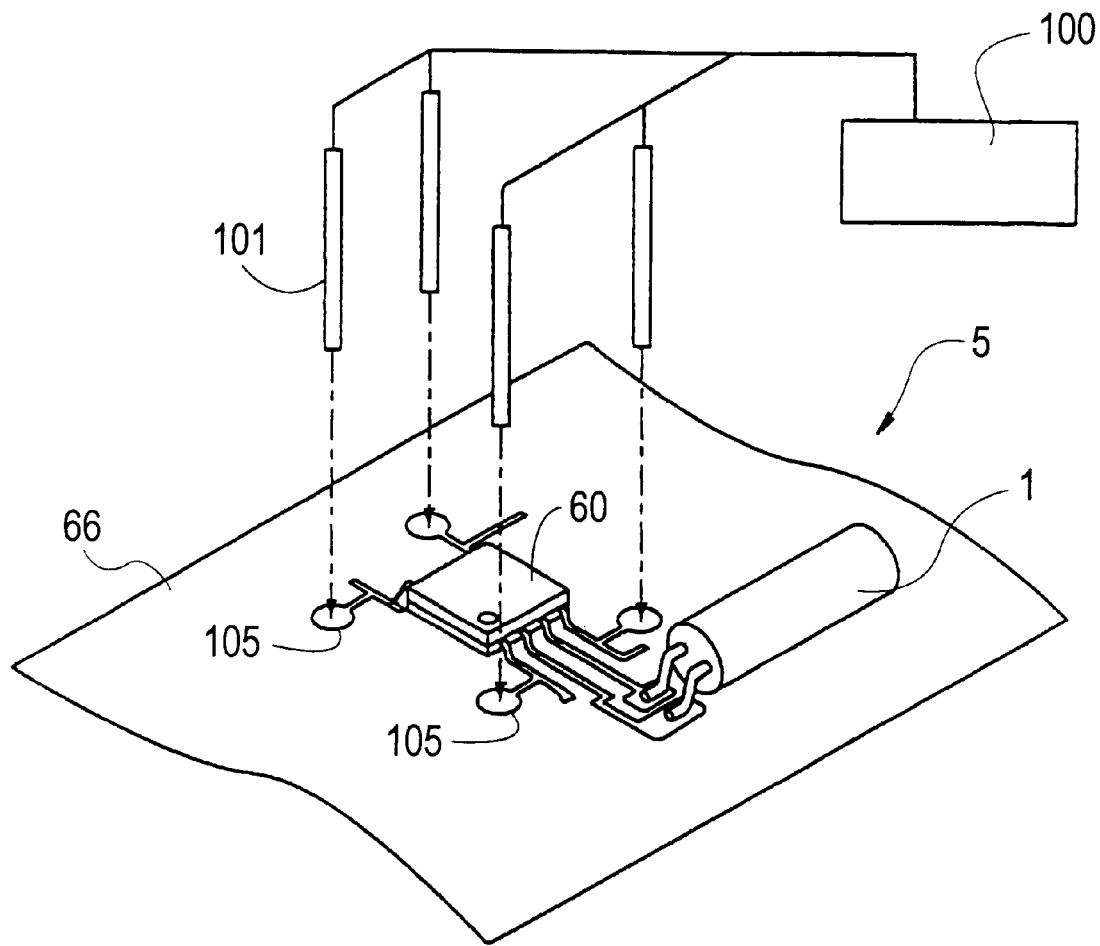
FIG. 16 is a diagram showing a further example of the oscillator of the present invention, constructed on a circuit board.

The oscillator of the present invention also comprises an oscillator 5 having a structure, such as that shown in FIG. 16, in which the quartz resonator 1 and IC 60 are respectively mounted on a substrate (circuit board) 66 without being packaged with a mold resin or the like. An oscillator 5 having an IC 60 and resonator 1 separately mounted in such a manner can be arranged by a user using a resonator having a characteristic or shape according to use and so on. In this manner, a more flexible system can be formed.

In the oscillators 5 in which the quartz resonator 1 and IC 60 are packaged integrally with each other, as well as in the oscillator 5 shown in FIG. 16, in which the quartz resonator 1 and IC 60 are mounted on circuit board 66 separately from each other, frequency setting can be performed after each oscillator 5 has been mounted on circuit board 66, and data of this setting may also be written in the ROM of the IC 60. It is also possible to perform frequency setting operations simultaneously with or before or after inspection of the circuit board 66.

It is possible that the output frequency of each oscillator 5 adjusted in a single state and the output frequency of the oscillator 5 in the state of being mounted on circuit board 66 differ slightly from each other. If frequency setting is performed after mounting of the oscillator 5 on the circuit board 66, there is no possibility of an occurrence of such a variation in output frequency, and a signal can be obtained with improved accuracy.

Figure 17:
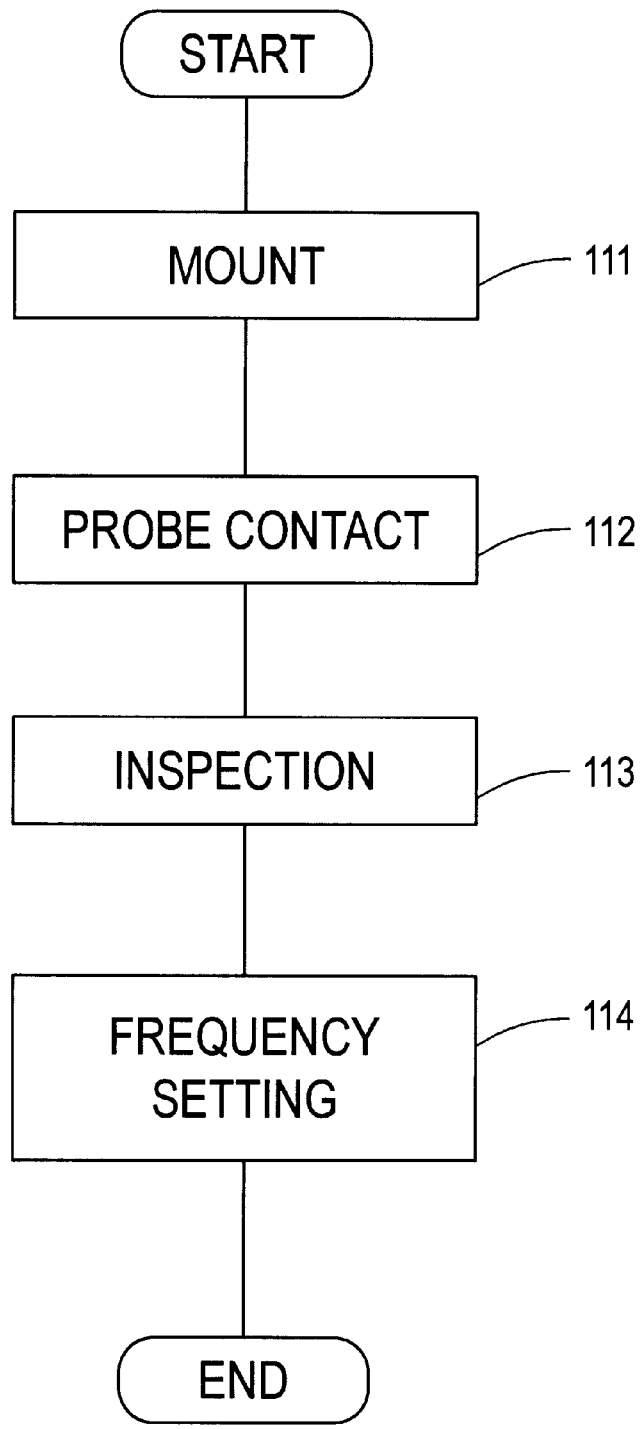
FIG. 17 is a flowchart showing the process of performing frequency adjustment of an oscillator mounted on a circuit board.

The oscillator 5 in accordance with the present invention can be set to a suitable frequency required by a user. Needless to say, operations for this setting may be performed on the maker side and may also be performed on the user side. The setting can be immediately adapted to the design of a system or a change in the system. In such a case, however, a new operation for setting a frequency on the user side must be performed, resulting in an increase in the number of process steps. On the other hand, it is possible to perform a sequence of steps, such as shown in FIG. 17, i.e., the step of mounting oscillator 5 on the circuit board (step 111), the step of connecting probes 101 to a circuit or to special pads 105 on circuit board 66 for the purpose of circuit board inspection (step 112), the step of performing circuit board inspection (step 113), and the step of performing frequency setting by the process shown in FIG. 8 or 9 (step 114). If such a frequency setting method is used, the oscillator of the present invention can be assembled and shipped by the same process as that for the conventional oscillators in which frequencies are uniquely determined.

If such a frequency setting method is used, it is desirable to use a frequency setting apparatus 100 having probes 101 connectable to the pads or the circuit connected to the oscillator 5 on the circuit board, and having the functions of determining an amount of adjustment of capacitance arrays, frequency dividing numbers M, N, and X and writing these values to the ROM of IC 60. Needless to say, this frequency setting apparatus may also have the function of inspecting the circuit board, as mentioned above.

Probes 101 may be directly connected to terminals of the oscillator 5. However, special or ordinary patterns, such as pads 105, for contact with probes 101 may be provided as shown in FIG. 16 to improve the reliability of the frequency setting operations.

In the conventional oscillators, as described with reference to these examples, combinations of frequency dividing numbers with respect to the frequencies to be output are previously set in a memory and the frequency of a signal output from the oscillator is determined by one of the combinations used. In contrast, according to the present invention, not based on the idea of previously setting combinations of frequency dividing numbers, frequency dividing numbers M, N, and X can be variably set independent of each other. In the oscillator of the present invention, therefore, innumerable combinations of frequency dividing numbers M, N, and X can be used, so that the number of frequencies producible by one oscillator can be largely increased by enabling selection of any suitable one of such combinations. It is, therefore, possible to provide an oscillator capable of covering a wide frequency range and obtaining an output signal with high accuracy by using a high-precision quartz resonator which is stable in performance, and which can be manufactured at a low cost. Moreover, the arrangement enabling free setting of frequency dividing numbers M, N, and X ensures that frequency dividing numbers M, N, and X can be set according to the resonant frequency of each quartz resonator employed, thus making it possible to remove the troublesome steps for frequency adjustment, which have been necessary in the conventional art. Further, the adjustment circuit is provided to enable generation of output signals having frequencies which cannot be covered by only changing the frequency dividing numbers M, N, and X.

INDUSTRIAL APPLICABILITY

As described above, the present invention makes it possible to supply, in a short period and at a low cost, an oscillator capable of outputting a signal of any frequency required by users, and to use a low-priced quartz resonator capable of oscillating stably as a vibration source for an oscillator capable of outputting frequencies in a wide range. Consequently, it is possible to provide an oscillator suitable for communication apparatuses and information processors with which oscillator performance more stable and accurate than that for conventional apparatuses is required.

What is claimed is:

1. An oscillator comprising:

a piezoelectric resonator;

an oscillation signal output section that oscillates the piezoelectric resonator and outputs an oscillation signal of a first frequency;

a first programmable divider that divides the first frequency of said oscillation signal by a first frequency dividing number to obtain a reference signal of a second frequency;

a PLL circuit section that receives said reference signal input thereto and obtains a multiplied signal of a third frequency, said PLL circuit section multiplying said input reference signal by a second frequency dividing number from a second programmable divider provided in a feedback circuit to obtain said multiplied signal; and a setting section that variably sets said first frequency dividing number and said second frequency dividing number to values independent of each other, said piezoelectric resonator, said oscillation signal output section, said first programmable divider, said PLL circuit section and said setting section being packaged integrally with each other, the oscillator further comprising a bypass circuit that directly outputs said oscillation signal without passing the oscillation signal through the first programmable divider and the PLL circuit section.

2. The oscillator according to claim 1, further comprising a third programmable divider that divides said multiplied signal by a third frequency dividing number, said setting section variably setting said third frequency dividing number to a value independent of said first frequency dividing number and said second frequency dividing number.

3. The oscillator according to claim 1, said oscillation signal output section having an adjustment circuit that finely adjusts said first frequency with respect to a resonant frequency of said piezoelectric resonator, and said setting section setting an adjustment amount for said adjustment circuit.

4. The oscillator according to claim 3, said adjustment circuit having a plurality of weighted capacitance arrays.

5. The oscillator according to claim 3, said adjustment circuit having a variable-capacitance diode.

6. The oscillator according to claim 1, said setting section having a plurality of ROMs, and at least said first frequency diving number and said second frequency dividing number being set in one of said ROMs.

7. The oscillator according to claim 6, said oscillation signal output section having an adjustment circuit that finely adjusts said first frequency with respect to a resonant frequency of said piezoelectric resonator, and at least said first frequency dividing number and said second frequency dividing number and an adjustment amount for said adjustment circuit being set in one of said ROMs.

8. The oscillator according to claim 6, further comprising an input section that controls an operating state of the oscillator, information designating a function to be controlled by said input section being set in said ROMs.

9. An oscillator comprising:

a piezoelectric resonator;

an oscillation signal output section that oscillates the piezoelectric resonator and outputs an oscillation signal of a first frequency;

a first programmable divider that divides the first frequency of said oscillation signal by a first frequency dividing number to obtain a reference signal of a second frequency;

a PLL circuit section that receives said reference signal input thereto and obtains a multiplied signal of a third frequency, said PLL circuit section multiplying said input reference signal by a second frequency dividing number from a second programmable divider provided in a feedback circuit to obtain said multiplied signal; and a setting section that variably sets said first frequency dividing number and said second frequency dividing, number to values independent of each other, said piezoelectric resonator being a rectangular AT cut quartz resonator that oscillates a fundamental wave of 25.1 MHz.

10. A frequency setting method for an oscillator comprising:

measuring a resonant frequency of a piezoelectric resonator using a bypass circuit that directly outputs an oscillation signal without passing the oscillation signal through a first programmable divider and a PLL circuit section;

outputting the oscillation signal of a first frequency by finely adjusting the resonant frequency of the piezoelectric resonator;

outputting a reference signal of a second frequency by dividing the first frequency of the oscillation signal by a first frequency dividing number;

operating a PLL circuit by using the reference signal as an input signal to the PLL circuit;

forming a multiplied signal of a third frequency by multiplying said input signal by a second frequency dividing number from a second programmable divider provided in a feedback circuit in the PLL circuit;

setting, on a basis of sad resonant frequency unadjusted, said first frequency dividing number and said second frequency dividing number to numbers that said third frequency of the multiplied signal is obtained as a frequency closest to a desired frequency; and performing fine adjustment to adjust said third frequency equal to said desired frequency.

11. The frequency setting method for an oscillator according to claim 10 setting said first frequency dividing number and said second frequency dividing number and performing, fine adjustment being performed after said oscillator has been mounted on a circuit board.

12. A frequency setting method for an oscillator comprising:

outputting an oscillation signal of a first frequency by finely adjusting a resonant frequency of a piezoelectric resonator;

outputting a reference signal of a second frequency by dividing the first frequency of the oscillation signal by a first frequency dividing number;

operating a PLL circuit by using t he reference signal as an input signal to the PLL circuit;

forming a multiplied signal of a third frequency by multiplying said input signal by a second frequency dividing number from a second programmable divider provided in a feedback circuit in the PLL circuit;

setting, on a basis of said resonant frequency unadjusted, said first frequency dividing number and said second frequency dividing number to numbers that said third frequency of the multiplied signal is obtained as a frequency closest to a desired frequency; and performing fine adjustment to adjust said third frequency equal to said desired frequency, setting said first frequency dividing number and said second frequency dividing number and performing fine adjustment being performed in a process of inspecting, by using probes, a circuit board on which said oscillator is mounted.

13. A frequency setting method for an oscillator comprising:

measuring a resonant frequency of a piezoelectric resonator using a bypass circuit that directly outputs an oscillation signal without passing the oscillation signal through a first programmable divider and a PLL circuit section;

outputting an oscillation signal of a first frequency by finely adjusting the resonant frequency of the piezoelectric resonator;

outputting a reference signal of a second frequency by dividing the first frequency of the oscillation signal by a first frequency dividing number;

operating a PLL circuit by using the reference signal as an input signal to the PLL circuit;

forming a multiplied signal of a third frequency by multiplying said input signal by a second frequency dividing number from a second programmable divider provided in a feedback circuit in the PLL circuit;

setting, on a basis of an ideal resonant frequency of said piezoelectric resonator, said first frequency dividing number and said second frequency dividing number to numbers that said third frequency of the multiplied signal is obtained as a frequency closest to a desired frequency; and finely adjusting, on a basis of said first frequency dividing number and said second frequency dividing number obtained, said first frequency to a value that said desired frequency is obtained.

14. The frequency setting method for an oscillator according to claim 13, setting said first frequency dividing number and said second frequency dividing number and performing fine adjustment being performed after said oscillator has been mounted on a circuit board.

15. A frequency setting method for an oscillator comprising:

outputting an oscillation signal of a first frequency by finely adjusting a resonant frequency of a piezoelectric resonator;

outputting a reference signal of a second frequency by dividing the first frequency of the oscillation signal by a first frequency dividing number;

operating a PLL circuit by using the reference signal as an input signal to the PLL circuit;

forming a multiplied signal of a third frequency by multiplying said input signal by a second frequency dividing number from a second programmable divider provided in a feedback circuit in the PLL circuit;

setting, on a basis of an ideal resonant frequency of said piezoelectric resonator, said first frequency dividing number and said second frequency dividing number to numbers that said third frequency of the multiplied signal is obtained as a frequency closest to a desired frequency; and finely adjusting, on a basis of said first frequency dividing number and said second frequency dividing number obtained, said first frequency to a value that said desired frequency is obtained, setting said first frequency dividing number and said second frequency dividing number and performing fine adjustment performed in a process of inspecting, by using probes, a circuit board on which said oscillator is mounted.

16. A frequency setting system for an oscillator, said frequency setting system outputting an oscillation signal of a first frequency by finely adjusting a resonant frequency of a piezoelectric resonator, outputting a reference signal of a second frequency by dividing the first frequency of the oscillation signal by a first frequency dividing number, operating a PLL circuit by using the reference signal as an input signal to the PLL circuit to form a multiplied signal of a third frequency, the multiplied signal being obtained by multiplying said input signal by a second frequency dividing number from a second programmable divider provided in a feedback circuit in the PLL circuit, said frequency setting system comprising:

a ROM that stores an amount of fine adjustment of the resonant frequency and said first frequency dividing number and said second frequency dividing number;

probes attachable to a circuit board on which said oscillator is mounted; and a frequency setting apparatus that determines said fine adjustment amount and said first frequency dividing number and said second frequency dividing number through said probes, and sets the fine adjustment amount and said first frequency dividing number and said second frequency dividing number in said ROM.

17. The frequency setting system for an oscillator according to claim 16, said frequency setting apparatus inspecting said circuit board through said probes.

* * * * *